United States Patent [19]
Scoones

[11] Patent Number: 5,642,059
[45] Date of Patent: Jun. 24, 1997

[54] BUS DRIVER CIRCUIT WITH OVERVOLTAGE PROTECTION

[75] Inventor: Kevin Scoones, Moosburg, Germany

[73] Assignee: Texas Instruments Deutschland GmbH, Germany

[21] Appl. No.: 481,548

[22] Filed: Jun. 7, 1995

[30] Foreign Application Priority Data

Mar. 30, 1995 [EP] European Pat. Off. .............. 95104708

[51] Int. Cl.$^6$ ................ H03K 19/0175; H03K 19/0948; H03K 19/082
[52] U.S. Cl. ................... 326/86; 326/81; 326/84
[58] Field of Search .................. 326/80–81, 85–86, 326/84, 109–110, 30

[56] References Cited

U.S. PATENT DOCUMENTS

| 4,581,551 | 4/1986 | Campbell, Jr. ............... 326/80 |
| 5,004,936 | 4/1991 | Andresen .................. 326/27 |
| 5,019,720 | 5/1991 | Skoog et al. . | |
| 5,053,643 | 10/1991 | Tanaka et al. . | |
| 5,153,464 | 10/1992 | Joly ....................... 326/85 |
| 5,184,034 | 2/1993 | Ohannes et al. . | |
| 5,406,140 | 4/1995 | Wert et al. ................ 326/81 |
| 5,432,462 | 7/1995 | Obregon et al. ............. 326/85 |

FOREIGN PATENT DOCUMENTS 0366083 5/1990 European Pat. Off. .
0545361A1 6/1993 European Pat. Off. .

*Primary Examiner*—Edward P. Westin
*Assistant Examiner*—Jon Santamauro
*Attorney, Agent, or Firm*—David S. Guttman; W. James Brady, III; Richard L. Donaldson

[57] ABSTRACT

A bus driver circuit having a driver input (16) for the reception of a data signal and a driver output (20) for the application of the output voltage of a voltage source (Vcc) to a bus core (10) in a manner dependent on the presence of a data signal at the driver input (16). It possesses a first controllable switch (A) placed between the voltage source (Vcc) and the driver output (20) and a control circuit loop (B), which on the application of the data signal to the driver input (16) is able to be placed in an active state by its producing a drive signal putting the controllable switch (A) in a conducting state. A second controllable switch (C) is between the control circuit loop (B) and the driver input (16). A comparator (D) compares the voltage at the driver output (20) with a reference voltage ($V_{ref}$) and when the voltage at the driver output (20) exceeds the output voltage (Vcc) of the source, provides a control signal which turns off the second controllable switch (C) and puts the control switch loop (B) in the inactive state by turning off the first controllable switch (A).

5 Claims, 1 Drawing Sheet

BUS DRIVER CIRCUIT WITH OVERVOLTAGE PROTECTION

FIELD OF THE INVENTION

The invention relates to a bus driver circuit as defined in the preamble of claim 1 herein.

BACKGROUND OF INVENTION

Bus driver circuits apply signals to a data transmission bus which transmits them to data receivers. In this respect, the bus is part of a system of data transmitters and data receivers; for example, the data transmitters can be sensors and the data receivers control or indicating circuits.

Conventionally, the information transmitted by the bus is digital signals, the presence of a signal value of 1 being recognized, for example, if a positive voltage of 5V is applied to the bus. The bus driver circuit produces this +5V at the core of the bus. Since the core of the bus is typically connected with a large number of bus driver circuits, interference may cause a voltage higher than +5V to occur on the bus. In this case, it is necessary to take steps to assure that this higher voltage does not lead to an excessively heavy load for the source supplying the +5V. The higher voltage might also cause the voltage at the bus core to be tied to a certain level and not be able to be altered again.

One object of my invention is to provide a bus driver circuit without the above-mentioned problems which may be produced as an integrated circuit requiring a small amount of space on a semiconductor chip.

DETAILED DESCRIPTION OF DRAWINGS

Figure 1:
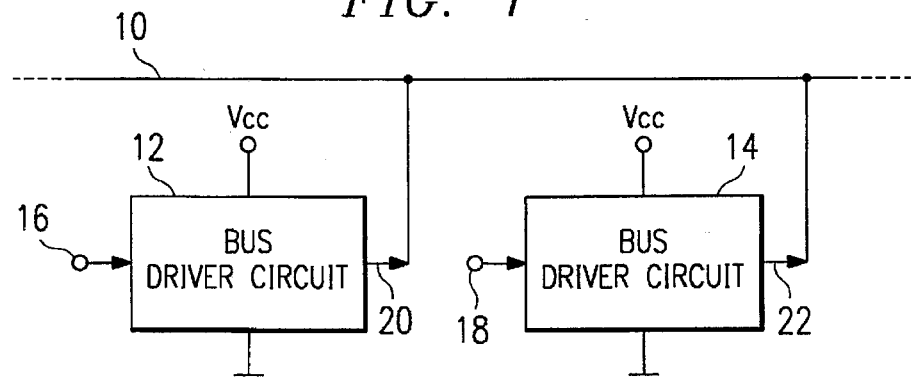
FIG. 1 shows a diagrammatic representation in order to explain the use of the bus driver circuit in accordance with the invention for driving a bus.

FIG. 1 shows one section of a bus core 10 connected to which two driver circuits 12 and 14. Typically, several driver circuits are normally connected to one such bus core. Each bus driver circuit 10, 12 has a respective driver input 16, 18, to which a data signal may be applied to be fed to the bus. The data signals may for example include signals from sensors or other signal-producing components. The data signals are applied to the bus via bus corresponding outputs 20, 22.

Bus driver circuits 12, 14 are powered by a constant voltage source Vcc, for example +5V. The "1" data signals are applied to the bus core 10 by coupling the voltage Vcc to bus core 10.

Figure 2:
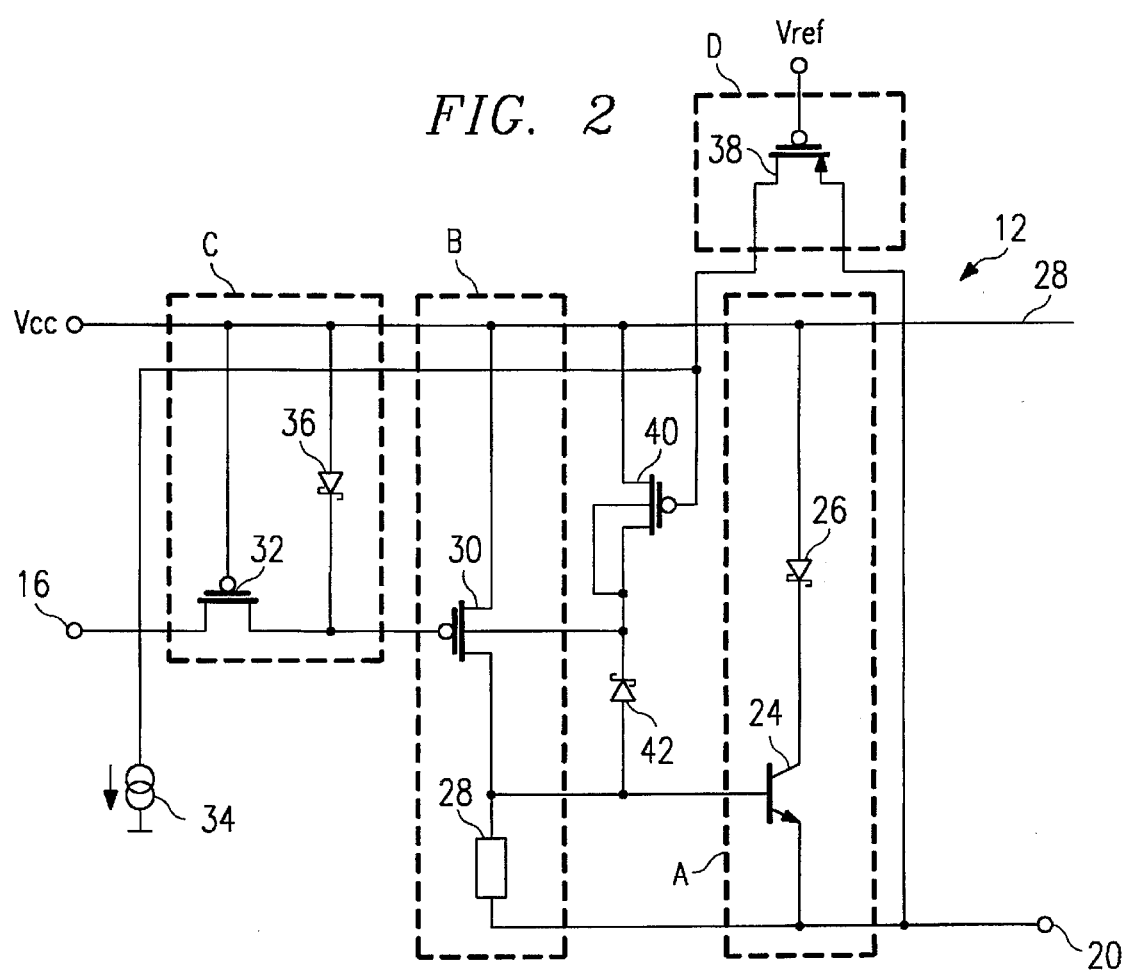
FIG. 2 is a circuit diagram of an embodiment of a bus driver circuit according to the invention.

FIG. 2 shows an embodiment of my improved bus driver circuit 12. Bus driver circuit 14 can be designed in the same manner.

For switching the voltage Vcc to the output 20, bus driver circuit 12 has a bipolar NPN transistor 24 whose collector to emitter path is connected in series between a Vcc line 28 and an output terminal 20 with a first Schottky diode 26. Schottky diode 26 and NPN transistor 24 form a first controllable switch A.

The base of transistor 24 is connected to a node between one end of a resistor 28 and the source of a PMOS transistor 30, whose drain is connected to the Vcc line 28. The other end of resistor 28 is connected to output terminal 20. PMOS transistor 30 and resistor 28 together constitute a control circuit path with whose aid controllable switch A can be operated.

The gate of PMOS transistor 30 is connected via the source-drain path of a further PMOS transistor 32 with a driver input 16 terminal. Transistor 32 has its gate connected via a current source 24 to ground and also via a second Schottky diode 36 to its drain. PMOS transistor 32 and Schottky diode 36 form a second controllable switch C.

A comparator D formed of further PMOS transistor 38, is placed so that its source-drain path is connected between output terminal 20 and the gate of PMOS transistor 32. The gate connection of transistor 38 is connected to a reference voltage $V_{ref}$, whose purpose will be indicated below.

Between Vcc line 28 and the base of the transistor 24, there is a series circuit of the source-drain path of a PMOS transistor 40 and a third Schottky diode 42. The gate transistor 40 is connected with the drain of transistor 38 and with the gate of transistor 32. The node between the source of transistor 40 and the cathode of diode 42 is connected with the substrate well of transistor 30. The function of transistor 40 and Schottky diode 42 will be explained below.

The operation of bus driver circuit 12 will be now explained in more detail.

Firstly, suppose no data signal is applied to bus core 10. Then a LOW signal must be present at the driver output terminal 20, whereas suppose driver input terminal 16 is HIGH at +5V. This means that PMOS transistor 30 is OFF so that no current flows along its source drain path and accordingly no current flows through resistor 28. Accordingly, the base of NPN transistor 24 also is at a LOW or INACTIVATE signal voltage, keeping this transistor OFF. Current source 34, via which a LOW current of approximately 10 to 50 mA will flow at all times, keeps the gate of PMOS transistor 32 at ground so that this transistor will be ON or CLOSED. Diode 36 is in then biased in the non-conducting direction, so it will be without effect. PMOS transistor 38 also is turned OFF, because the voltage at its source, which is connected with LOW driver output terminal 20, is lower than the voltage at its gate, which has a value in the order of +4V.

If now a LOW data signal is applied to the driver input 16, such signal will cause PMOS transistor 30 to switch ON. Accordingly a current will flow through resistor 28 producing a voltage drop for an ACTIVATE signal at the base of NPN transistor 24. Transistor 24 will switch ON coupling Vcc line 28 to driver output terminal 20. At Schottky diode 26 and NPN transistor 24 there will only a small voltage drop, so the voltage at output terminal 20 will be near Vcc (+5V) in practice at about +4V. This switching through of voltage Vcc to bus core 10 can be detected by devices connected to the bus, for example by a receiver connected with the bus core, such receiver then performing processing of the data signal.

But suppose a trouble condition occurs in the bus system such that a voltage higher than +5V occurs at the bus core 10. Measures must be taken to ensure that the source supplying this voltage is not excessively loaded by the active bus driver circuit. Trouble conditions of this type may for example be caused by capacitive pick-up.

When a voltage in excess of +5V occurs on the bus core 10, this voltage passes via driver output terminal 20 to the source of PMOS transistor 38. Since the voltage $V_{ref}$ at its gate is smaller than +5V, transistor 38 will turn ON so that the high voltage will also arrive at the anode of Schottky diode 36 and the gate of PMOS transistor 32. Via Schottky diode 36 the high voltage will reach the gate of PMOS transistor 30, which is thus turned OFF or OPEN. Furthermore the PMOS transistor 32 will pass into the turned OFF condition. The turning OFF of the PMOS transistor 30 means that no more voltage drop will occur so that an INACTIVATE signal is produced; accordingly the NPN transistor 24 will also be turned OFF. The source supplying the voltage Vcc is consequently no longer loaded, since no current is able to flow through NPN transistor 24. The turning transistor 32 causes a decoupling of the driver input 16 from the gate of transistor 30.

PMOS transistor 38 acts as a comparator D, which compares the voltage at driver output terminal 20 (and accordingly at the bus core 10) with voltage $V_{ref}$ and supplies a control signal to the controllable switch C of Schottky diode 36 and PMOS transistor 32 to turn OFF PMOS transistor 30, when the voltage at the bus core 10 exceeds the supply voltage Vcc of +5V.

The function of the driver circuit described of preventing loading of the source supplying the voltage Vcc, when a voltage of more than Vcc appears on the bus is always available, even if the driver circuit is inactive because it does not receive any data signal at the driver input.

During the manufacture of the bus driver circuit as an integrated circuit, the components for decoupling the source Vcc from driver output terminal 20, may be produced on a small area of the substrate of terminal the integrated circuit because they are merely effective as a switch and do not have to reduce the undesired current from the source of the voltage Vcc by having a high resistance. PMOS transistor 40 and the Schottky diode 42 are required to avoid the undesired effects of the diodes, present in the integrated circuit, between the source connection and the well, in which PMOS transistor 30 is formed. These undesired effects are called back gate effects in English technical literature; the means employed for preventing them are of conventional design.

I claim:

1. A bus driver circuit for connection to a bus line having a bus voltage, comprising:

a power terminal for receiving a power voltage $V_{cc}$;

a driver input terminal for receiving a data signal which can be either HIGH or LOW;

a driver output terminal for connection to the bus line;

a control circuit having a control input, responsive to LOW and HIGH signals at its control input for respectively coupling and decoupling the driver output terminal to the power terminal;

a normally CLOSED input switch having a safety input, responsive to LOW and HIGH signals at its safety input for respectively coupling and decoupling the data signal at the driver input terminal to the control input; and a comparison circuit for (i) providing a LOW signal to the input switch's safety input when the bus voltage normally does not exceed the power voltage, but (ii) providing a HIGH signal to the input switch's safety input and the control circuit's control input when the bus voltage exceeds the power voltage;

whereby when the bus voltage exceeds the power voltage the comparison circuit causes the control circuit to decouple the driver output terminal from the power terminal.

2. The bus driver circuit of claim 1 wherein the input switch is a PMOS transistor whose source and drain are respectively coupled to the control input and the driver input terminal, and whose gate is the safety input.

3. The bus driver circuit of claim 1 wherein the control circuit comprises a Schottky diode in series with the source-drain path of an NPN transistor.

4. The bus driver circuit of claim 1 wherein the control circuit comprises:

a control switch having a control input, responsive to LOW and HIGH signals at its control input for respectively generating corresponding ACTIVATE and INACTIVATE signals; and an output switch responsive to the ACTIVATE and INACTIVATE signals for respectively coupling and decoupling the driver output terminal to the power terminal.

5. The bus driver circuit of claim 2 wherein the control switch comprises includes a PMOS transistor which is switched ON to produce the ACTIVATE signal and switched OFF to produce the INACTIVATE signal.

* * * * *